United States Patent
Liang

(10) Patent No.: US 10,867,594 B1
(45) Date of Patent: Dec. 15, 2020

(54) AUDIO APPARATUS AND AUDIO METHOD THEREOF

(71) Applicant: xMEMS Labs, Inc., Los Altos, CA (US)

(72) Inventor: Jemm Yue Liang, Sunnyvale, CA (US)

(73) Assignee: xMEMS Labs, Inc., Santa Clara, CA (US)

(*) Notice: Subject to any disclaimer, the term of this patent is extended or adjusted under 35 U.S.C. 154(b) by 0 days.

(21) Appl. No.: 16/821,983

(22) Filed: Mar. 17, 2020

Related U.S. Application Data

(60) Provisional application No. 62/909,684, filed on Oct. 2, 2019.

(51) Int. Cl.
| | |
|---|---|
| *G10K 11/178* | (2006.01) |
| *H04R 19/04* | (2006.01) |
| *H04R 17/02* | (2006.01) |
| *H03F 3/181* | (2006.01) |

(52) U.S. Cl.
CPC .. *G10K 11/17854* (2018.01); *G10K 11/17873* (2018.01); *H04R 17/02* (2013.01); *H04R 19/04* (2013.01); *G10K 2210/3028* (2013.01); *G10K 2210/3044* (2013.01); *H03F 3/181* (2013.01)

(58) Field of Classification Search
CPC ....... G10K 11/17854; G10K 11/17873; G10K 2210/3044; G10K 2210/3028; H04R 19/04; H04R 17/02; H03F 3/18
See application file for complete search history.

(56) References Cited

U.S. PATENT DOCUMENTS

| | | | |
|---|---|---|---|
| 6,366,675 B1* | 4/2002 | Toda | A61B 7/04 310/313 B |
| 9,392,366 B1* | 7/2016 | Meyer | H04R 25/505 |
| 2008/0112570 A1* | 5/2008 | Asada | G10K 11/17855 381/71.6 |
| 2008/0247560 A1 | 10/2008 | Fukuda | |
| 2010/0105447 A1 | 4/2010 | Sibbald | |
| 2011/0079253 A1* | 4/2011 | Hasegawa | H01L 21/67057 134/184 |

(Continued)

FOREIGN PATENT DOCUMENTS

| | | |
|---|---|---|
| EP | 3 480 809 A1 | 5/2019 |
| GB | 2479359 A | 10/2011 |

OTHER PUBLICATIONS

Knowles et al., Frequency Response and Latency of MEMS Microphones: Theory and Practice, 2017, Knowles Electronics, LLC, Itasca, IL, USA, pp. 1-10, XP055723801.

(Continued)

*Primary Examiner* — Akelaw Teshale
(74) *Attorney, Agent, or Firm* — Winston Hsu

(57) ABSTRACT

An audio apparatus includes a sound sensing device, a first amplifier and a sound producing device. The sound sensing device configured to detect an ambient sound pressure. The first amplifier coupled to the sound sensing device is configured to convert a first signal corresponding to the ambient sound pressure into a second signal with inverted polarity of the first signal. The sound producing device is coupled to the first amplifier and configured to produce a counter sound pressure corresponding to the second signal. Overall phase delay from the ambient sound pressure to the counter sound pressure is less than 25 degrees.

25 Claims, 4 Drawing Sheets

(56) References Cited

U.S. PATENT DOCUMENTS

| | | | |
|---|---|---|---|
| 2012/0177238 A1* | 7/2012 | Enamito | H04R 1/2819 |
| | | | 381/349 |
| 2018/0122356 A1 | 5/2018 | Yoo | |
| 2019/0028803 A1* | 1/2019 | Benattar | H04R 1/406 |
| 2019/0088244 A1* | 3/2019 | Goto | B64C 39/024 |
| 2019/0237058 A1 | 8/2019 | Vogel | |

OTHER PUBLICATIONS

E. Sturtzer et al., High fidelity microelectromechanical system electrodynamic micro-speaker characterization, Journal of Applied Physics, American Institute of Physics vol. 113, No. 21, pp. 214905-1-214905-8, 2013, AIP Publishing LLC, XP012174353.

* cited by examiner

US 10,867,594 B1

AUDIO APPARATUS AND AUDIO METHOD THEREOF

CROSS REFERENCE TO RELATED APPLICATIONS

This application claims the benefit of U.S. provisional application No. 62/909,684, filed on Oct. 2, 2019, which is all incorporated herein by reference.

BACKGROUND OF THE INVENTION

1. Field of the Invention

The present invention relates to an audio apparatus and an audio method, and more particularly, to audio apparatuses and audio methods, which optimize the quality of active noise cancellation.

2. Description of the Prior Art

Active noise canceling (ANC) technology involves sensing ambient sound pressure with a microphone, generating a signal corresponding to the sensed ambient sound pressure, and driving a sound producing device with the signal to produce counter sound pressure to cancel out the ambient sound pressure. In other words, active noise canceling technology aims to form a listening ambient that is acoustically isolated from the environment.

In an ideal active noise canceling device, the ambient sound pressure and the counter sound pressure should be time aligned in terms of amplitude, i.e. have 0-phase difference, but are exactly opposite in terms of polarity. In conventional active noise canceling device devices, however, there are multiple sources of delays which create difficult challenges in such perfect phase relationship. For example, the output voltages of both resistor-terminated condenser microphones and dynamic microphones are proportional to the acceleration of their sensing membrane, and hence have a 90-degree phase delay behind the sound wave. In addition, there is an additional 90-degree phase delay from the driving signal of sound producing device to the sound pressure produced by the conventional coil and magnet, Lorenz-force based, sound producing device.

Typically, 180-degree phase shift may be accomplished by combining a condenser or dynamic microphone, which produces a 90-degree phase delay, with a force-based sound producing device for an additional 90-degree phase delay. Nevertheless, intermittent low frequency noises such as thumping noise when tires run over uneven road surfaces can be hardly blocked out due to the latency caused by such 180° phase delay. On the other hand, the upper limit of effective frequency range of the active noise canceling technology can also be lowered due to those two phase delays mentioned above. Consequently, there is a need to improve the existing active noise canceling technology by removing all latencies along the signal chain so as to allow a zone of ultimate silence to be created.

SUMMARY OF THE INVENTION

It is therefore a primary objective of the present invention to provide an audio apparatus and an audio method, which exhibits near-zero phase delay to ensure superior broadband ambient noise isolation quality.

An embodiment of the present invention provides an audio apparatus. The audio apparatus includes a sound sensing device, a first amplifier and a sound producing device. The sound sensing device configured to detect an ambient sound pressure. The first amplifier coupled to the sound sensing device is configured to convert a first signal corresponding to the ambient sound pressure into a second signal with inverted polarity of the first signal. The sound producing device is coupled to the first amplifier and configured to produce a counter sound pressure corresponding to the second signal. Overall phase delay from the ambient sound pressure to the counter sound pressure is less than 25 degrees.

Another embodiment of the present invention provides an audio method. The audio method includes generating a first signal according to an ambient sound pressure, converting the first signal corresponding to the ambient sound pressure into a second signal with inverted polarity of the first signal, and producing a counter sound pressure corresponding to the second signal. Overall phase delay from the ambient sound pressure to the counter sound pressure is less than 25 degrees.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
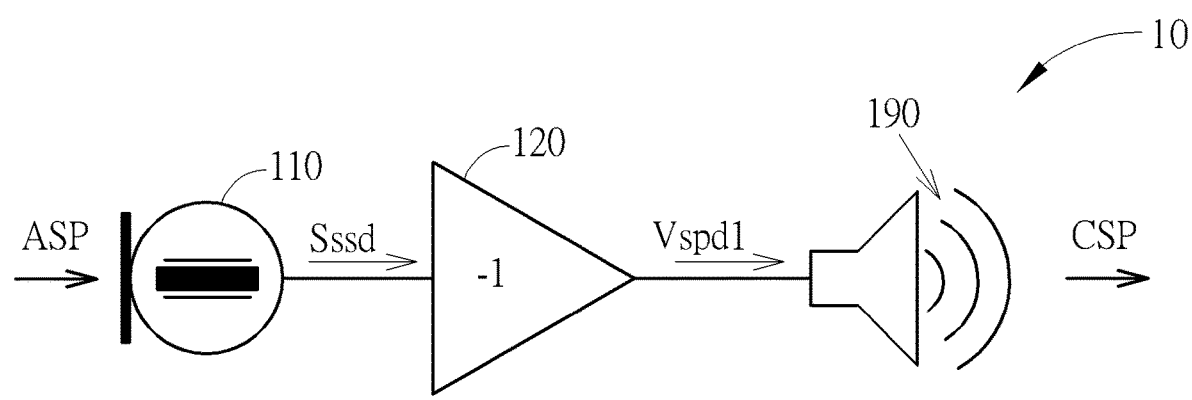
FIG. 1 is a schematic diagram of an audio apparatus according to an embodiment of the present invention.

Please refer to FIG. 1. FIG. 1 is a schematic diagram of an (audio) apparatus 10 according to an embodiment of the present invention. The audio apparatus 10 may be disposed in an in-ear, on-ear or over-ear headset and use active noise cancelling (ANC) technology to reduce broadband background noise. Alternatively, the audio apparatus 10 may be disposed in a transportation means such as car, bus or train and use ANC technology to reduce lower register ambient noise of suitably long wavelength. The audio apparatus 10 includes a sound sensing device 110, an amplifier 120 and a sound producing device 190. The sound sensing device 110 detects and measures ambient sound pressure ASP and generates a signal Sssd (also referred to as the first signal), which may be either in digital or analog format, according to the ambient sound pressure ASP substantially without phase delay.

In some embodiments a closed feedback control loop can be formed by adding a second sound sensing device (for example, a sound sensing device 130 shown in FIG. 6) to sense sound pressure at vicinity of the sound producing device 190 such that the sound pressure sensed by the sound sensing device 130 is the result of combining the ambient sound pressure ASP with the counter sound pressure CSP produced by the sound producing device 190.

The amplifier 120 (also referred to as the first amplifier) coupled between the sound sensing device 110 and the sound producing device 190 converts the signal Sssd into a second signal with inverted polarity of the signal Sssd. Therefore, the amplifier 120 is labeled "−1". As shown in FIG. 1, the second signal, labeled as driving voltage Vspd1, drives the sound producing device 190 to produce the counter sound pressure CSP. The statement "signal Sssd is polarity inverted into the second signal" shall refer to any suitable signal or wiring inversion scheme such that the sound producing device 190 is caused to produce a sound pressure of inverted polarity relative to the ambient sound pressure ASP sensed by the sound sensing device 110. The circuits illustrated in the present disclosure are only one example of such possibilities.

Briefly, since the polarity of the counter sound pressure CSP is opposite to the polarity of the ambient sound pressure ASP, an effect called destructive interference occurs which result in reduction of the net sound pressure perceived by a listener. Namely, when both the sound sensing device 110 and the sound producing device 190 have near-zero phase delay, the overall delay through the signal chain of the audio apparatus 10 (namely, from the ambient sound pressure ASP sensed by the sound sensing device 110 to the counter sound pressure CSP produced by the sound producing device 190) would also be near-zero phase delay. Specifically, the overall phase delay from the ambient sound pressure ASP to counter the sound pressure CSP should be less than 25 degree, and preferably less than 12 degrees for the sound sensing device 110 and the sound producing device 190 individually. Thereby, the apparatus 10 achieves near-zero phase delay in the generation of the counter sound pressure CSP and produces the desired destructive interference with near-zero phase delay and, consequently, improves the noise cancelling performance of the audio apparatus 10.

Figure 2:
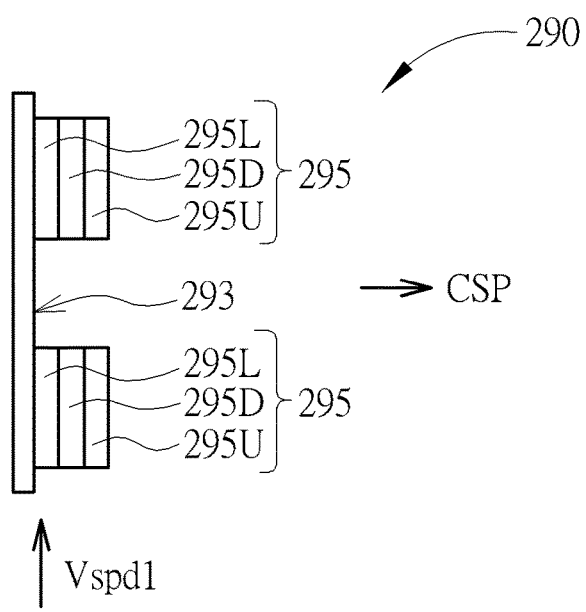
FIG. 2 is a schematic diagram of a sound producing device according to an embodiment of the present invention.

Please refer to FIG. 2 for an embodiment of a sound producing device 290 based on piezoelectric actuated moving membrane. In FIG. 2, the sound producing device 290 configured to realize the sound producing device 190 includes a (moving) membrane 293 and an actuator 295 attached to said moving membrane 293. When driving signal is applied to the actuator 295 of the sound producing device 290, the moving membrane 293 of the sound producing device 290 is caused to displace from its neutral position and resulting in membrane movement. Specifically, for the actuator 295 made of piezoelectric material, the displacement of the membrane 293 will be proportion to the voltage applied to the (piezoelectric) actuator 295. Therefore, the counter sound pressure CSP generated by the membrane 293 of the (piezoelectric actuated) sound producing device 290 as shown in FIG. 2 can eliminate the phase delay (also referred to as phase lag) between driving signal and the air pressure thusly produced. Specifically, the (driving) voltage Vspd1 applied to the (piezoelectric) actuator 295 of the sound producing device 290 induces a deformation of piezo material which result in displacement (namely, Dspd1 in formula-1) of the membrane 293 that is proportional to the voltage Vspd1 in real time, with near-zero phase delay. That is to say, the displacement of the moving membrane 293 of the sound producing device 290 reaches its maximum when the driving voltage Vspd1 is at its maximum. The displacement of the moving membrane 293 is at its minimum when the voltage Vspd1 is at its minimum. The displacement of the moving membrane 293 is zero when the driving voltage Vspd1 is 0V (namely, its equilibrium position). In some embodiments, the (driving) voltage Vspd1 of the second signal applied to the sound producing device 290 results in the displacement of the (moving) membrane 293 of the sound producing device 290 with phase delay less than 12 degrees. The (driving) voltage Vspd1 of the second signal applied to the sound producing device 290 results in the counter sound pressure CSP with phase delay less than 12 degrees.

In free-field environment, acoustic sound pressure can be generated by accelerating membrane where sound pressure is generally related to the acceleration of membrane by $P \propto Acc \cdot S$. On the other hand, sound pressure within a seal space, such as within the ear canal, sound pressure of lower registers may be generated based on chamber compression principle because a sealed chamber is formed when the ear piece of an in-ear headset is inserted into the ear canal of listener. Sound pressure generated due to chamber compression may be expressed as $P \propto (\Delta Vspd/Vcanal) \propto Dspd1 \propto Vspd1$ (formula-1), wherein P is the sound pressure in the ear canal (namely, the counter sound pressure CSP), Dspd1 is the displacement of the moving membrane 293 of the sound producing device 290, $\Delta Vspd$ is volume change caused by the displacement Dspd1 of the moving membrane 293 of the sound producing device 290, Vcanal is the volume within ear canal, and Vspd1 is the driving voltage of the sound producing device 290.

When the audio apparatus 10 is employed in an in-ear headset, the distance from the moving membrane 293 of the sound producing device 290 to the tympani of ear is approximately the same as the length of the ear canal, which is nominally 27 millimeters (mm) for a typical human ear. The wavelength of 2.5 Kilo hertz (Hz) is 137 mm, which is about 5 times larger than 27 millimeters. It means, for a time period equal to one cycle of 2.5 Kilohertz (kHz), the sound can travel back and forth 5 times between the sound producing device 290 and the tympani of the ear. In other words, for audio frequency below 2.5 kHz, the pressure with ear canal can generally be assume to be at a steady state, and therefore the sound pressure CSP within the closed chamber defined by ear canal and apparatus 10 can be directly related to the membrane displacement by $P \propto Dspd1 \propto Vspd1$ (formula-1). In other words, for sound below 2.5 kHz, the sound pressure within a sealed ear canal is directly proportional to the membrane displacement Dspd1 which, in turn, is directly proportional to driving voltage Vspd1.

Generally speaking, instead of force-based sound producing device such as conventional coil-magnet speakers, suitable embodiment for the sound producing device 190 should belongs to a class of sound producing device called position-based sound producing device, which means the position of the sound producing membrane (for example, the membrane 293) within the sound producing device 190 should be controlled directly by the driving voltage Vspd1 of the sound producing device 190.

In some embodiments, the (position-based) sound producing device 190 may be a piezoelectric actuated device. In some embodiments, thin film piezoelectric material, such as PZT, AlN or AlScN, may be coated over a thin-film membrane layer, made of material such as SOI-Si or POLY-Si, to form the (piezoelectric-actuated moving) membrane (for example, the membrane 293) of the sound producing device 190. Such a thin-film membrane, with piezo actuator (for example, the actuator 295) coated and patterned over it, may be fabricated using microelectromechanical system (MEMS) device fabrication processes.

In other embodiment, the position-based sound producing device 190 may comprise a moving membrane actuated by nanoscopic electrostatic drive (or NED, for example see paper published by Fraunhofer IPMS).

In some embodiments, the sound producing device 190 may be implemented as a sound producing device in U.S. application Ser. Nos. 16/695,199, 16/882,554, or 16/802,569, all of which are able to meet such near zero phase delay requirement over a wide frequency band.

In comparison, conventional force-based speaker such as Lorenz force based coil-magnet-membrane speakers, the 90-degree phase delay occurs as a result of Newton laws which stipulates the displacement of membrane is given as $Dspd2=Acc \cdot t^2/2$, where Dspd2 is the displacement of a moving membrane, Acc is the acceleration of the membrane and t is time interval corresponding to the displacement. For Lorenz-force based coil-magnet device, Acc results from the force generate by the interaction between the magnet flux and the current flowing through the coil. For frequency below approximately 300-600 Hz, the impedance of conventional speaker coil is dominated by the resistivity of coil winding, and the current flowing through coil can be approximated by dividing the voltage applied across the coil by the nominal impedance of the coil, i.e. $Acc \propto (Vspd2/Zspd2) \propto Vspd2$ and therefore $Dspd2 \propto Vspd2 \cdot t^2/2$. Vspd2 is the voltage applied across the coil. For frequency above 300-600 Hz, additional phase delay will need to be introduced to incorporate the rising impendence of inductance of the coil. Such further phase delay due to coil inductance simply makes the phase delay even worse for Lorenz force-based speaker, and will be overlooked below for brevity of the discussion.

For clarity of discussion, a single frequency sine wave motion is taken as an example. As taught in high-school level physics, the displacement Dspd2 of the membrane motion described by Newton motion equation $Dspd2 \propto Vspd2 \cdot t^2/2$ will reach its peak values (namely, the maximum or minimum of Dspd2) when the voltage Vspd2 is zero. The value of the voltage Vspd2 will be at its maximum absolute value when the displacement Dspd2 becomes zero (namely, the moving membrane is at its equilibrium position). That is to say, in in-ear headset application where an ear piece is inserted into the ear canal to form a sealed chamber, there is a 90-degree phase delay from the driving signal to the sound pressure when the sound producing device is a force-based sound producing device.

Consider intermittent low-frequency noises such as thumping noise of tires running over uneven road surfaces, of train crossing rail sections, of doors/drawers opening or slammed close in an office environment, of motorcycle tail pipe noise zooming by pedestrians on the side walk. All of these scenarios produce significant amount of one-shot low frequency noise spikes that can be hardly blocked by conventional ANC apparatus due to phase delays of both its sound sensing device and its sound producing device.

Besides intermittent lower frequency noises, the upper limit of effective frequency range of an ANC apparatus will also be severely lowered by such phase delay. Since high frequency noise cancelling requires high precision destructive interference, any additional phase delays just make it harder to align the counter sound pressure CSP with the ambient sound pressure ASP. Given the importance of such alignment, the elimination of all sources of phase delay will help extend the upper limit of effective frequency range of ANC.

In summary, by virtue of the near zero phase delay from the sound sensing device 110 to the sound producing device 190, the audio apparatus 10 can produce counter sound pressure with near-zero phase delay, which can not only suppress non-stationary ambient noises of very low frequency but also extend the upper bound of its effective active noise canceling frequency range and thus achieve a broad band ambient noise suppression.

In the sound producing device 290 shown in FIG. 2, the actuator 295 may comprise PZT (namely, Pb (ZrTi) $O_3$) film or AlScN film as a layer 295D which is sandwiched between a (bottom) electrode layer 295L and a (top) electrode layer 295U. Applying the voltage Vspd1 to the sound producing device 290 means that the voltage Vspd1 is applied across the top electrode layers 295U and the bottom electrode layer 295L of the actuators 295. With the voltage Vspd1 applied across its electrodes, the actuators 295 deform according to the (applied) voltage Vspd1. Such deformation causes the attached membrane 293 to also deform and subsequently produce up-down movement according to the details of mechanical design of the moving membrane 293.

The construct of the sound producing device 290 is a low-pass-filter such that when frequency component of the voltage Vspd1 is significantly below the frequencies of all resonance modes of the sound producing device 290, the displacement of the membrane 293 can be approximately estimated based on static state piezoelectric-mechanical modeling. However, when the frequency of driving signal rises, an electromechanical system such as the sound producing device 290 of FIG. 2 is bound to resonate at several resonance frequencies. Among the resonance frequencies, the lowest resonance frequency (also referred to as the mode 1 resonance) is usually the strongest and can severely disrupt both the amplitude and the phase of the counter sound pressure CSP, causing phase misalignments and amplitude distortions between the voltage Vspd1 and the counter sound pressure CSP.

In order to achieve the near-zero phase delay objective laid out for the apparatus 10, the (suitable) sound producing device 290 should have all of its resonance frequency at least 3-times, and preferably 5-times, higher than the upper bound of the frequency range targeted for ANC operation. For example, for an ANC system design where the upper bound of the ANC frequency range is 3 kHz, then the resonance frequencies of the sound producing device 290 need to be no lower than 9 kHz, and preferably above 15 kHz. When such conditions are met, a signal produced by an ANC controller (for example, a signal Sfs from an ANC controller 430 shown in FIG. 4 to FIG. 6) will contain only frequency components significantly below the lowest resonance frequency of the sound producing device 290. In other words, the membrane 293 of the sound producing device 290 can respond to the signal Sfs generated by the ANC controller fast enough such that the membrane displacement (namely, Dspd1 in formula 1) has low distortion and near-zero phase delay.

Other than near-zero phase delay on the sound producing side, it is also desirable that, on the sound sensing side, when the ambient sound pressure ASP impinges upon the sound sensing device 110 and induces the signal Sssd to be generated from the sound sensing device 110, the peaks of the signal Sssd should align with the peaks of the ambient sound pressure ASP and the valleys of the signal Sssd should align with the valley of the ambient sound pressure ASP. In other words, it is desirable that the apparatus 10 also generates the signal Sssd with near-zero phase delay from the ambient sound pressure ASP. In some embodiments, the ambient sound pressure ASP induces the signal Sssd to be generated from the sound sensing device 110 with phase delay less than 12 degrees.

Figure 3A:
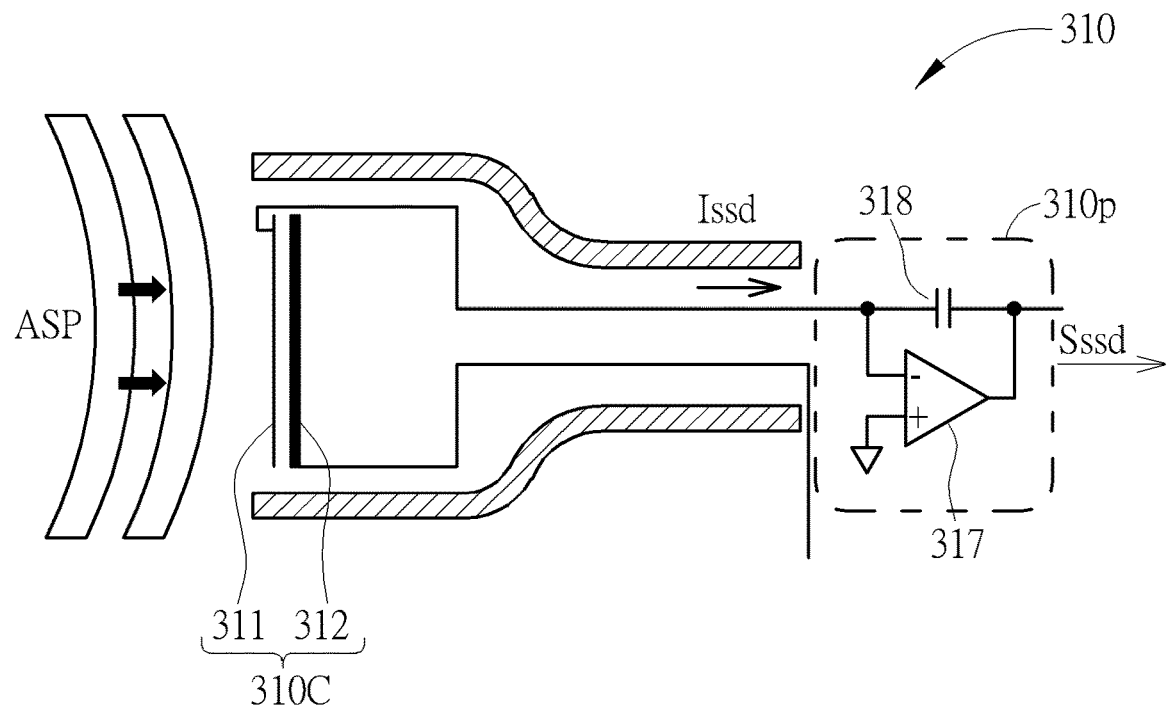
FIG. 3A is a schematic diagram of a sound sensing device according to an embodiment of the present invention.

To achieve near-zero phase delay, please refer to FIG. 3A. FIG. 3A is a schematic diagram of a sound sensing device 310 according to an embodiment of the present invention.

The sound sensing device 310 may be configured to realize the near-zero phase delay sound sensing device 110. In FIG. 3A, the sound sensing device 310 may be implemented as a microelectromechanical system (MEMS) device with a capacitive sensing element 310C defined by the overlapping area between (electrode) plates 311 and 312. The electrode plate 311 may be a moving thin film membrane to serve as a capacitive sensing membrane, whereas the electrode plate 312 may be a perforated plate. The terminal of the plate 311 is connected to a signal conversion circuit 310P. The signal conversion circuit 310P, which includes at least an amplifier 317 and a capacitor 318 in the topology of a current integrator, integrates a current signal Issd, which is received from the terminal connected to the plate 311. The current of the sound sensing device 310 is converted into the signal Sssd by the signal conversion circuit 310P.

To function properly as a high precision current integrator, the amplifier 317 should be implemented by a low-noise, low-drift, high gain instrumental grade operational amplifier, preferably with low-leakage field-effect transistor (FET) input stage.

The operation of the sound sensing device 310, which is a condenser microphone, requires a static electric field between plate 311 and plate 312. Such static electric field can be produced either by an external low-ripple/low-noise voltage source or by imbuing one of the plate electrodes, such as plate 312, with permanent charges. In the event an external voltage source is used, the voltage source may be connected between ground and the terminal connected to the plate 312, while leaving the terminal of the plate 311 connected to amplifier 317 for the current signal.

The plate 311, which is typically made of very fine membrane, may move backwards and forwards upon the impingement of the ambient sound pressure ASP. This movement of the plate 311 changes the distance between the plates 311 and 312 and results in changes of the capacitance between the plates 311, 312. The capacitance between the two plates 311, 312 is expressed as $C=\varepsilon \cdot A/D$, where A is the overlapping area between the plates 311-312, D is the distance between the plates 311-312, and $\varepsilon_0$ is dielectric constant of air. When a static voltage Vdc is applied across the plates 311-312, charge $Q=Vdc \cdot C$ will be established between the plates 311-312. When the distance D between the plates 311-312 changes, the charge Q also changes. The charge variation is expressed as $\Delta Q=Vdc \cdot \Delta C$ and such change in charge Q results in the current signal Issd been generated and transmitted to the signal conversion circuit 310P where the current integrator (circuit), comprised of amplifier 317 and capacitor 318, turns the current signal Issd into the signal Sssd.

Detail operation of the current integrator circuit and its related optimization are taught in college level engineering courses and will be skipped here for brevity. Suffice it to say, with a sound implementation of current integrator circuit, the signal conversion circuit 310P will convert the charge variation $\Delta Q$ induced by the variation of capacitance $\Delta C$ due to movements of the plate 311 as a result of impinging the ambient sound pressure ASP into the voltage signal Sssd where $$Sssd \propto \int_t \frac{-I_{SSD}}{C_{318}} \cdot dt =$$

-continued
$$\int_t \frac{-dQ}{C_{318} \cdot dt} \cdot dt = \frac{-V_{DC} \cdot dC_{310C}}{C_{318}} \propto -dC_{310C} \propto -d\left(\frac{\varepsilon_0 \cdot A}{D}\right) \propto \Delta D.$$

$C_{318}$ is capacitance of the capacitor 318, $C_{310c}$ is capacitance of the capacitive sensing element 310C. In other words, the signal Sssd is proportional to $\Delta D$ which is the change of spacing between the plates 311-312 of the capacitive sensing element 310C. Since $\Delta D$ equals the movement of the plate 311 which is directly proportional to the magnitude of the ambient sound pressure ASP, the signal Sssd also changes directly with respect to changes of the ambient sound pressure ASP, without phase delay.

Figure 3B:
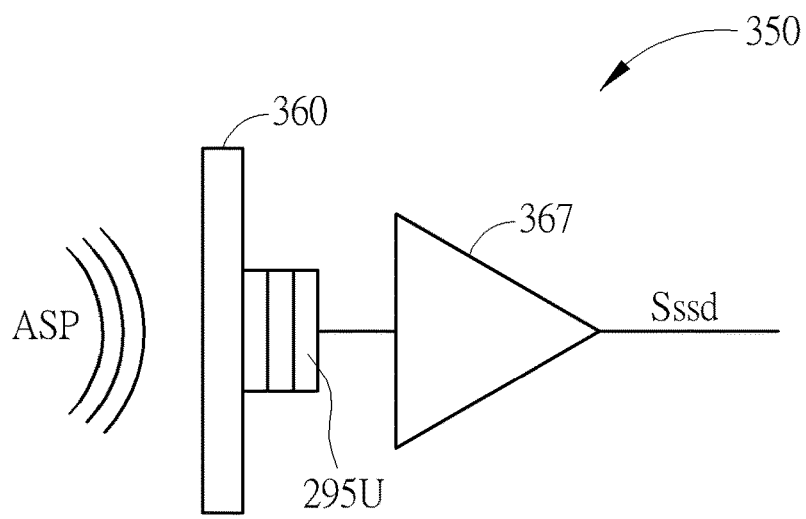
FIG. 3B is a schematic diagram of a sound sensing device according to an embodiment of the present invention.

Please refer to FIG. 3B. As an alternative to the sound sensing device 310 with the signal conversion circuit 310P to convert current signal to voltage signal, a piezoelectric microphone is used instead. In the embodiment of FIG. 3B, a sound sensing device 350 comprises a (moving) membrane 360 which can be made of a thin SOI-Silicon or POLY-silicon membrane, coated with suitable piezoelectric sensing structure. The cross-sectional view of the (piezoelectric sound sensing) membrane 360 may be the same as the cross-section of the (piezoelectric actuated sound producing) membrane 293 (also referred to as piezoelectric sensing membrane 293) shown in FIG. 2 with a (piezoelectric material) layer 295D sandwiched between two electrode layers 295L, 295U.

Due to the piezoelectricity generation capability of the layer 295D, upon the impingement of the ambient sound pressure ASP on the membrane 360, the deformation of the membrane 360 will cause the (piezoelectric) layer 295D to generate a voltage signal corresponding to the amount of membrane movement and such piezoelectric voltage can be sensed across the electrode layers 295L, 295U. Since the signal produced by membrane 360 is already in voltage form, current to voltage conversion performed by such as the signal conversion circuit 310P of FIG. 3A is no longer necessary. However, voltage signal generated by the piezoelectric layer 295D will have very high impedance and therefore is not suitable for driving low impedance loads or capacitive load such as long signal path. To compensate for such a limit, an amplifier 367, preferably having a high-impedance and low-capacitance FET input stage, may be inserted to serve as a buffer to improve the driving capability of long signal path and/or low input impedance signal processing stages such as an analog-to-digital converter (ADC) with a sample-and-hold (S/H) circuit. The (current) amplifier 367 is configured to boost current driving capability of the signal Sssd.

Figure 4:
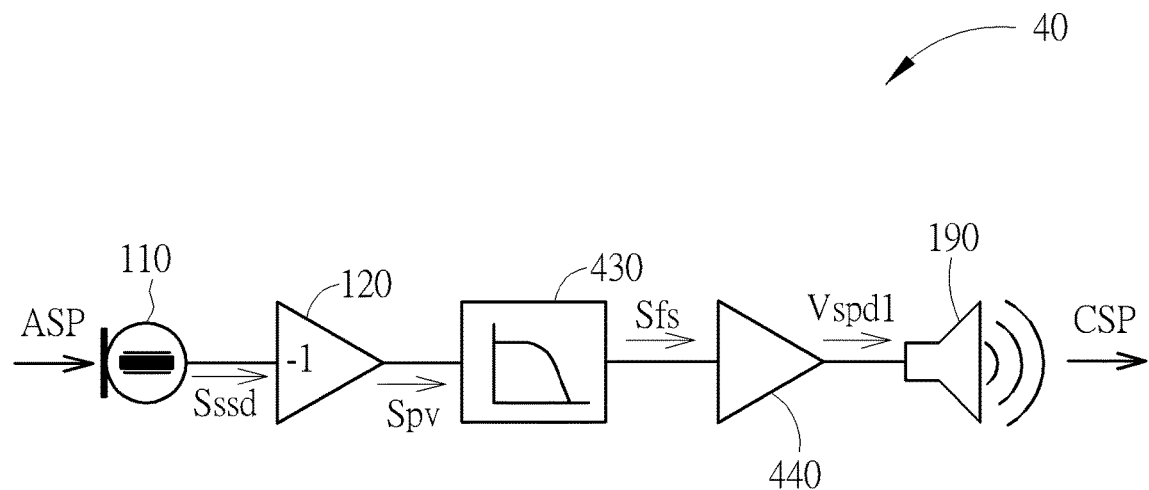
FIG. 4 to FIG. 6 are respectively schematic diagrams of an audio apparatus according to an embodiment of the present invention.

Please refer to FIG. 4. FIG. 4 is a schematic diagram of an audio apparatus 40 according to an embodiment of the present invention. The audio apparatus 40 shown in FIG. 4 is similar to the audio apparatus 10 shown in FIG. 1. Therefore, the same numerals and notations denote the same components in the following description, and the similar parts are not detailed redundantly. Distinct from the audio apparatus 10, the audio apparatus 40 further includes a filter 430 and an amplifier 440. The amplifier 120 converts the signal Sssd into a signal Spy by inverting the polarity of the signal Sssd. In some embodiments, the signal Sssd is further amplified by the amplifier 120 with a gain g such that Spv=−g·Sssd. The signal Spv is subsequently filtered by the filter 430 into desirable frequency response for active noise canceling. The purposes of the filter 430 are twofold: firstly, to compensate for the unevenness of passive noise isolation of the headset and, secondly, to limit the upper frequency band of the signal Spv to within an effective ANC frequency range.

Regarding the first purpose against unevenness of passive noise isolation, given the sealed chamber nature of in-ear headset applications, there are bound to be passive noise isolation means used in the headset, and the degree such passive isolation means suppresses noise and affects the frequency response can fluctuate wildly, which depends on how the headsets are mounted/inserted into the ears during each instance of use. Given the ultimate goal of ANC being minimizing sound pressure of ambient noise by controlling the destructive interference precisely, it is therefore of crucial importance to produce just the right amplitude of counter pressure, with a frequency profile matching the noise to be cancelled precisely. Otherwise, the counter pressure itself will become the noise. And, therefore, the objectives stated above are the purpose and function of amplifier gain of the amplifier 120 and the frequency response profile of the filter 430.

Figure 6:
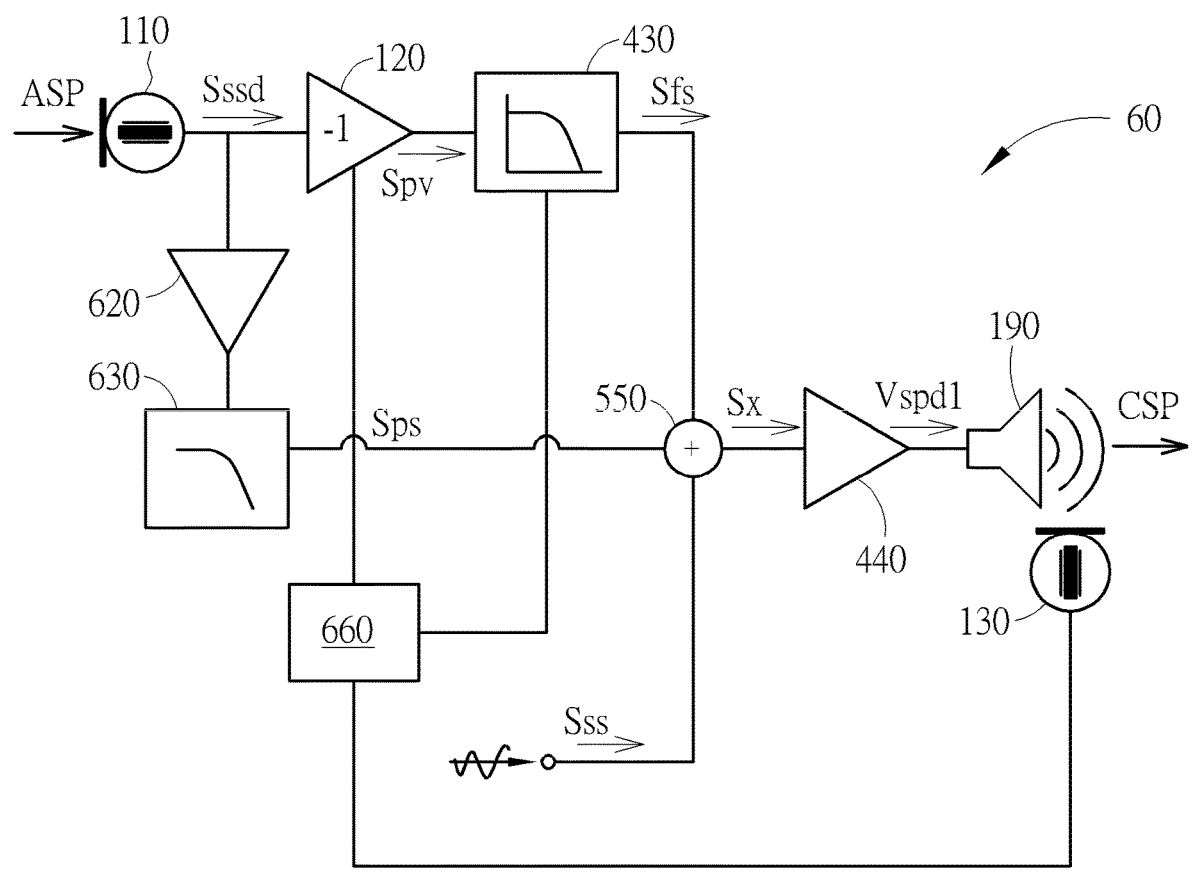

Furthermore, in order to fine tune the strength and frequency profile of the counter pressure, a closed-loop feedback control may be desirable. In FIG. 6, the (second) sound sensing device 130 is used to sense sound pressure in the vicinity of the sound producing device 190, such that the sound pressure sensed by the sound sensing device 130 is the ruminants of the destructive interference mentioned above, i.e. after the ambient sound pressure ASP, after passing through the passive noise isolation means, interacted with the counter sound pressure CSP produced by sound producing device 190. The output of the sound sensing device 130 will be analyzed by a management circuit 660 of FIG. 6 and its result will be used to fine-tune the gain of the amplifier 120 and the frequency response of the filter 430 in order to achieve the maximum noise cancellation effect.

Note that, instead of using the output of the sound sensing device 130 directly in the processing of the sound signal per se, the output of the sound sensing device 130 is used by the management circuit 660 to fine-tune parameters of sound processing stages, namely the gain of 120 and the frequency response of filter 430; therefore, no new audio signal latency will be introduced by the addition of the sound sensing device 130 or the formation of closed-loop feedback control system involving the management circuit 660 of FIG. 6.

Regarding the second purpose of limit frequency range of the signal Spv, due to the near-zero phase delay characteristic from the sound sensing device 110 to the sound producing device 190, the apparatus 40 does not need to have a lower bound in its effective frequency range. On the other hand, despite drastically reduced latency, the apparatus 40 still have an upper limit in its effective frequency range. Depending on the total latency of circuit used in implementation of the apparatus 40, the upper bound may occur between 2 kHz to 5 kHz, corresponding to a latency of 0.5 milliseconds (ms) to 0.2 ms. Generally speaking, the shorter the total latency from the sound sensing device 110 to the sound producing device 190 (namely, a speaker) is, the higher the upper bound of the frequency range of the filter 430 can be.

Figure 5:
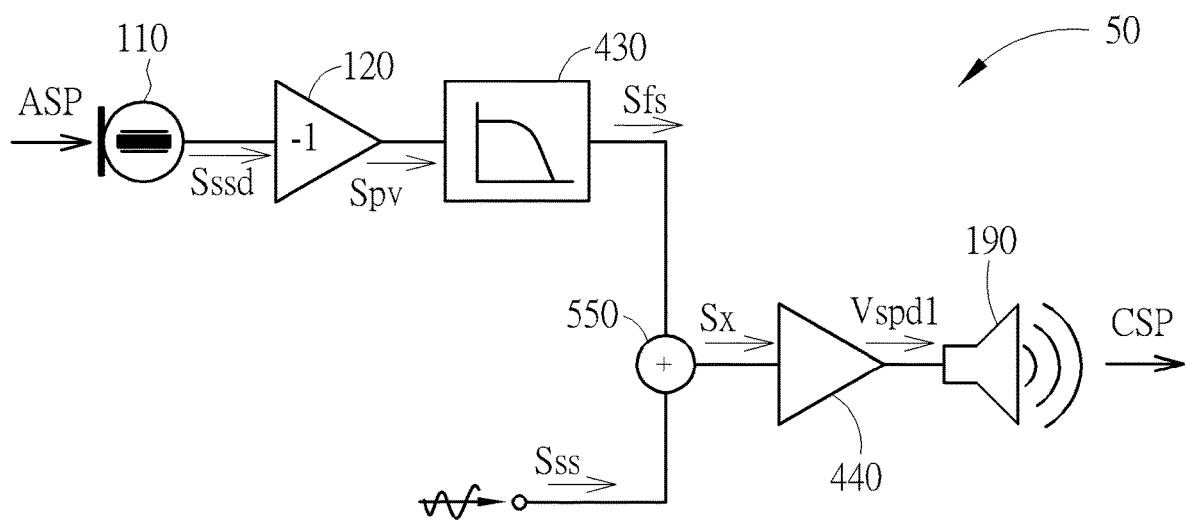

Please refer to FIG. 5. FIG. 5 is a schematic diagram of an audio apparatus 50 according to an embodiment of the present invention. The audio apparatus 50 shown in FIG. 5 is similar to the audio apparatus 40 shown in FIG. 4. Distinct from the audio apparatus 40, the audio apparatus 50 further includes a mixer 550. The signal Sfs output from the filter 430 is combined with a (sound) signal Sss (also referred to as the third signal) from a sound source such as music decoded from MP3 or MP4, video sound track, YouTube, phone conversation or other type of audio and/or music sources. The mixer 550 sums together the signals Sss, Sfs and outputs a signal Sx. The (power) amplifier 440 amplifies the signal Sx to produces the driving voltage Vspd1 for the sound producing device 190. As a result, the counter sound pressure CSP produced by the sound producing device 190 is generated according to both the (ANC) signal Sfs and the (sound source) signal Sss. The portion of the counter sound pressure CSP produced according to the ANC signal Sfs will cancel out the ambient noise passing through passive noise filter of in-ear headset, resulting in only very low level ambient noise, and therefore allow the portion of the counter sound pressure CSP generated according to the sound signal Sss to be heard clearly by the listener, with very little ambient noise interference.

Please refer to FIG. 6. FIG. 6 is a schematic diagram of an audio apparatus 60 according to an embodiment of the present invention. The audio apparatus 60 shown in FIG. 6 is similar to the audio apparatus 50 shown in FIG. 5. Distinct from the audio apparatus 50, the audio apparatus 60 further includes the (second) sound sensing device 130, placed in the vicinity of the sound producing device 190, and the management circuit 660 serving as an intelligent management unit managing the function of active noise canceling and/or ambient passthrough.

The management circuit 660 will analyze the signal Sssd to detect certain keyword(s) or specific sound pattern(s) from the (ambient sound) signal Sssd. Example of keywords may include "excuse me", "listen", "stop", "help", "Mammy", "Daddy", "Honey", the name or nickname of the user of the audio apparatus 60, etc. Example of specific sound patterns may include "car horn", "ambulance siren", and "fire alarm", to name but a few. There may also be programmed ambient-mode which user of apparatus 60 may select through gestures such as tabbing, squeezing, sliding, etc. Example of potential ambient-mode may include public-transport mode, metro-jogging mode, and office mode, to name but a few. In public-transport mode, all frequency is blocked and ambient-passthrough depends completely on keyword detection of the management circuit 660. In metro-jogging mode, frequency range corresponding to siren and horn may be allowed to partially pass through. In office mode, human voice range is allowed to pass through partially.

Upon detecting a keyword, a specific sound pattern or upon user selecting a pre-programmed ambient-mode, the management circuit 660 will determine, under such a state, which part of the frequency spectrum among the ambient sound is useful audio instead of noise. The management circuit 660 will channel the portion of useful range of ambient sound frequency from the signal Sssd to the mixer 550 by routing the signal Sssd through the (non-inverting) amplifier 620 and filter 630 where the gain of the amplifier 620 controls the volume of ambient audio to pass through and the filter 630 controls the frequency range of ambient audio to pass through. Signal Sps, which is the result of the signal Sssd passing through amplifier 620 and filter 630, will combine with the signals Sfs and Sss by mixer 550 to produce the signal Sx, which is amplified by the power amplifier 440 to become the driving signal for the sound producing device 190.

Different keywords, sound patterns, or user selectable ambient-modes may map to different sets of gains for the amplifiers 120, 620 and frequency response profiles for the filters 430, 630. Each set of settings is optimized for the needs of each specific condition associated with the detected keyword, sound pattern or user selectable ambient mode. Generally speaking, the portion of frequency spectrum where audio data is deemed as noise will show up prominently in the signal Sfs after the signal Sssd passed through the inverting amplifier 120 and filter 430 but will be suppressed in the signal Sps after the signal Sssd passed through the non-inverting amplifier 620 and filter 630; conversely, the portion of frequency spectrum where audio data is deemed useful will be suppressed in the signal Sfs after the signal Sssd passed through the inverting amplifier 120 and filter 430 but shows up prominently in the signal Sps after the signal Sssd passed through the non-inverting amplifier 620 and filter 630.

Note that the impact of the management circuit 660 is tuning the parameters of the amplifier 120 and filter 430, and its operation does not introduce changes of latency in ANC signal chain, which starts at the sound sensing device 110 and ends at the sound producing device 190. In other words, the management circuit 660 merely affects the action of active noise cancelling effects of the audio apparatus 60, without affecting the near-zero phase delay characteristics of the audio apparatus 60.

To sum up, the audio apparatus of the present invention achieves instantaneously, near-zero phase delay. In this manner, non-stationary ambient noises can be eliminated, and the effective frequency range of active noise canceling mechanism of the audio apparatus may be broader. The polarity of the counter sound pressure is opposite to the polarity of the ambient sound pressure to cause destructive interference, thereby actively reducing the net sound pressure perceived by a listener. Moreover, the sound sensing device of the audio apparatus may be of near-zero phase delay, and so is the sound producing device of the audio apparatus. The overall phase delay through the signal chain of the audio apparatus would be minimized to achieve near-zero phase delay in the audio apparatus and boost noise cancellation performance of the audio apparatus.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An audio apparatus, comprising:
   a sound sensing device, configured to detect an ambient sound pressure;
   a first amplifier, coupled to the sound sensing device, wherein the first amplifier is configured to convert a first signal corresponding to the ambient sound pressure into a second signal with inverted polarity of the first signal; and
   a sound producing device, coupled to the first amplifier and configured to produce a counter sound pressure corresponding to the second signal;
   wherein overall phase delay from the ambient sound pressure to the counter sound pressure is less than 25 degrees.

2. The audio apparatus of claim 1, wherein the first signal transmitted from the sound sensing device changes with respect to a change of the ambient sound pressure.

3. The audio apparatus of claim 1, wherein the ambient sound pressure impinges upon the sound sensing device and induces the first signal to be generated from the sound sensing device with phase delay less than 12 degrees.

4. The audio apparatus of claim 1, wherein the sound sensing device comprises a capacitive sensing membrane and a current integrator configured to convert current of the sound sensing device into the first signal.

5. The audio apparatus of claim 1, wherein the sound sensing device comprises a piezoelectric sensing membrane outputting a voltage signal and a current amplifier configured to boost current driving capability of the first signal.

6. The audio apparatus of claim 1, wherein a driving voltage of the second signal applied to the sound producing device results in a displacement of a membrane of the sound producing device with phase delay less than 12 degrees.

7. The audio apparatus of claim 1, wherein the sound producing device is position-based, wherein a displacement of a membrane of the sound producing device is proportional to a driving voltage of the second signal applied to the membrane.

8. The audio apparatus of claim 1, wherein resonance frequencies of the sound producing device are higher than a frequency range of the second signal.

9. The audio apparatus of claim 1, wherein a driving signal of the second signal applied to the sound producing device results in the counter sound pressure with phase delay less than 12 degrees.

10. The audio apparatus of claim 1, further comprising:
    a filter, coupled between the first amplifier and the sound producing device, wherein the filter is configured to compensate for unevenness of passive noise isolation of the audio apparatus or pass frequencies under an upper limit of a frequency range of active noise canceling.

11. The audio apparatus of claim 10, further comprising:
    a management circuit, coupled to the first amplifier or the filter, wherein the management circuit detects at least one keyword or at least one sound pattern from the first signal, wherein the management circuit controls amplification of the first amplifier or frequency response of the filter according to whether the at least one keyword or the at least one sound pattern is found in the first signal.

12. The audio apparatus of claim 1, further comprising:
    a mixer, coupled between the first amplifier and the sound producing device, wherein a third signal is transmitted from a sound source to the mixer, wherein the counter sound pressure is generated according to the second signal and the third signal.

13. An audio method, comprising:
    generating a first signal according to an ambient sound pressure;
    converting the first signal corresponding to the ambient sound pressure into a second signal with inverted polarity of the first signal; and
    producing a counter sound pressure corresponding to the second signal;
    wherein overall phase delay from the ambient sound pressure to the counter sound pressure is less than 25 degrees.

14. The audio method of claim 13, wherein the first signal changes with respect to a change of the ambient sound pressure.

15. The audio method of claim 13, wherein the ambient sound pressure induces the first signal with phase delay less than 12 degrees.

16. The audio method of claim 13, wherein a displacement of a membrane is proportional to a driving voltage of the second signal applied to the membrane.

17. The audio method of claim 13, wherein resonance frequencies are higher than a frequency range of the second signal.

18. The audio method of claim 13, wherein the first signal is output from a voltage buffer or a current integrator.

19. The audio method of claim 13, further comprising:
passing frequencies under an upper limit of a frequency range of active noise canceling.

20. The audio method of claim 19, further comprising:
detecting at least one keyword or at least one sound pattern from the first signal; and
controlling amplification or frequency response according to whether the at least one keyword or the at least one sound pattern is found in the first signal.

21. The audio method of claim 13, wherein the counter sound pressure is generated according to the second signal and a third signal from a sound source.

22. The audio method of claim 13, wherein current is converted into the first signal by a current integrator.

23. The audio method of claim 13, wherein current driving capability of the first signal is boosted by a current amplifier.

24. The audio method of claim 13, wherein a driving voltage of the second signal results in a displacement of a membrane with phase delay less than 12 degrees.

25. The audio method of claim 13, wherein a driving signal of the second signal applied to the sound producing device results in the counter sound pressure with phase delay less than 12 degrees.

* * * * *